(12) United States Patent
Keller et al.

(10) Patent No.: US 7,134,107 B1
(45) Date of Patent: Nov. 7, 2006

(54) SYSTEM AND METHOD FOR DETERMINING DETAIL OF ANALYSIS IN A CIRCUIT DESIGN

(75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 362 days.

(21) Appl. No.: 10/769,687

(22) Filed: Jan. 30, 2004

(51) Int. Cl.
*G06F 17/50* (2006.01)
*G06F 9/45* (2006.01)

(52) U.S. Cl. .................................. 716/5; 716/1; 716/4

(58) Field of Classification Search ............ 716/5, 716/1, 4
See application file for complete search history.

(56) References Cited

U.S. PATENT DOCUMENTS

| | | | |
|---|---|---|---|
| 6,408,264 B1 * | 6/2002 | Su et al. .................. | 703/14 |
| 6,591,402 B1 * | 7/2003 | Chandra et al. ............ | 716/5 |
| 2002/0188915 A1 * | 12/2002 | Hayes ...................... | 716/4 |
| 2004/0073877 A1 * | 4/2004 | Jones ...................... | 716/6 |
| 2004/0103377 A1 * | 5/2004 | Eaton et al. .............. | 716/1 |
| 2004/0237059 A1 * | 11/2004 | Chen et al. ............... | 716/10 |

OTHER PUBLICATIONS

Keller, S. Brandon; Rogers, Dennis R.; Robberts, George H., U.S. Appl. No. 10/647, 596, Entitled: System And Method Analyzing Design Elements In Computer Aided Design Tools; filed Aug. 25, 2003.

Keller, S. Brandon; Rogers, Dennis R.; Robberts, George H.; U.S. Appl. No. 10/647,608, Entitled: System And Method For Determining Unmatched Design Elements In A Computer-Automated Design; filed Aug. 25, 2003.

Keller, S. Brandon; Rogers, Dennis R.; Robberts, George H.; U.S. Appl. No. 10/647,606, Entitled: System And Method For Determining Connectivity Of Nets In A Hierarchical Circuit Design; filed Aug. 25, 2003.

Keller, S. Brandon; Rogers, Dennis R.; Robberts, George H., US. Appl. No. 10/647,598, Entitled: Computer Aided Design System And Methods With Reduced Memory Utilization; filed Aug. 25, 2003.

Keller, S. Brandon; Rogers, Dennis R., Robberts, George H.; U.S. Appl. No. 10/647,688, Entitled: System And Method For Iteratively Traversing a Hierarchical Circuit Design; filed Aug. 25, 2003.

Keller, S. Brandon; Rogers, Dennis R.; Robberts, George H.; U.S. Appl. No. 10/647,769, Entitled: Systems And Methods For Establishing Data Model Consistency Of Computer Aided Design Tools; filed Aug. 25, 2003.

Keller, S. Brandon; Rogers, Dennis R.; Robberts, George H.; U.S. Appl. No. 10/647,594, Entitled: Systems And Methods For Determining Activity Factors Of A Circuit Design; filed Aug. 25, 2003.

(Continued)

*Primary Examiner*—Thuan Do
*Assistant Examiner*—Magid Y. Dimyan

(57) ABSTRACT

A system, method and software product determine detail of analysis in a circuit design. Pull-up driver transistors of at least one stage of the circuit design are identified. Pull-down driver transistors of the stage are identified. Configuration commands associated with control signals of the pull-up and pull-down driver transistors are processed to determine if the pull-up driver transistors and pull-down driver transistors are tied on or tied off. A determination is made whether the stage has drive fight and switching current. A detailed analysis is performed of the stage of the stage has drive fight or switching current.

16 Claims, 5 Drawing Sheets

OTHER PUBLICATIONS

Keller, S. Brandon; Rogers, Dennis R.; Robberts, George H.; U.S. Appl. No. 10/647,687, Entitled: Systems And Methods Utilizing Fast Analysis Information During Detailed Analysis Of A Circuit Design; filed Aug. 25, 2003.

Keller, S. Brandon; Rogers, Dennis R.; Robberts, George H.; U.S. Appl. No. 10/647,595, Entitled: System And Method For Determining Applicable Configuration Information For Use In Analysis Of A Computer Aided Design; filed Aug. 25, 2003.

Keller, S. Brandon; Rogers, Dennis R.; Robberts, George H.; U.S. Appl. No. 10/647,607, Entitled: Systems And Methods For Identifying Data Sources Associated With A Circuit Design; filed Aug. 25, 2003.

Keller, S. Brandon; Rogers, Dennis R.; Robberts, George H.; U.S. Appl. No. 10/647,605, Entitled: Systems And Methods For Performing Circuit Analysis On A Circuit Design; filed Aug. 25, 2003.

Keller, S. Brandon; Rogers, Dennis R.; Robberts, George H.; U.S. Appl. No. 10/647,768. Entitled: System and Method For Determining A Highest Level Signal Name In A Hierarchical VLSI Design; filed Aug. 25, 2003.

Keller, S. Brandon; Rogers, Dennis R.; Robberts, George H.; U.S. Appl. No. 10/647,597, Entitled: System And Method For Determining Wire Capacitance For A VLSI Circuit; filed Aug. 25, 2003.

Keller, S. Brandon; Rogers, Dennis R.; Lelm, Charles A.; U.S. Appl. No. 10/706,682, Entitled Method And Program Product For Determining Nets Requiring Detailed Electromigration And Self Heating Analysis In A Digital Integrated Circuit; filed Nov. 12, 2003.

Keller, S. Brandon; Rogers, Dennis R.; Lelm, Charles A.; U.S. Appl. No. 10/706,698, Entitled: Method And Program Product For Performing Self-Heating Analysis In A Digital Integrated Circuit Through A Single Cycle Transient Simulation; filed Nov. 12, 2003.

Keller, S. Brandon; Rogers, Dennis R.; Lelm, Charles A.; U.S. Appl. No. 10/706,376, Entitled: Method And Program For Visual Display and One-Click Repair Of Electromigration And Self Heating Design-Rule Violations In A Digital Integrated Circuit Layout Database; filed Nov. 12, 2003.

Keller, S. Brandon; Rogers, Dennis R.; Lelm, Charles A.; U.S. Appl. No. 10/708,501, Entitled Method and Program Product For Performing Electromigration Analysis In A Digital Integrated Circuit By Converting A Netlist To A DC Model And Performing DC Analysis Of The DC Model; filed Nov. 12, 2003.

Keller, S. Brandon; Rogers, Dennis R.; Lelm, Charles A.; U.S. Appl No. 10/706, 526, Entitled: Method And Program Product For Performing A Worst Case Electromigration And Self Heating Analysis In A Digital Integrated Circuit With Worst-Case Superposition Of Partial Currents; filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; filed Nov. 12, 2003.

Keller, S. Brandon; Rogers, Dennis R.; Lelm, Charles A., U.S. Appl. No. 10/706,508, Entitled: Method And Program Product For Performing Self-Heating Analysis In A Digital Integrated Circuit Layout Database By Substituting Resistive Models For Active Devices; filed Nov. 12, 2003.

* cited by examiner

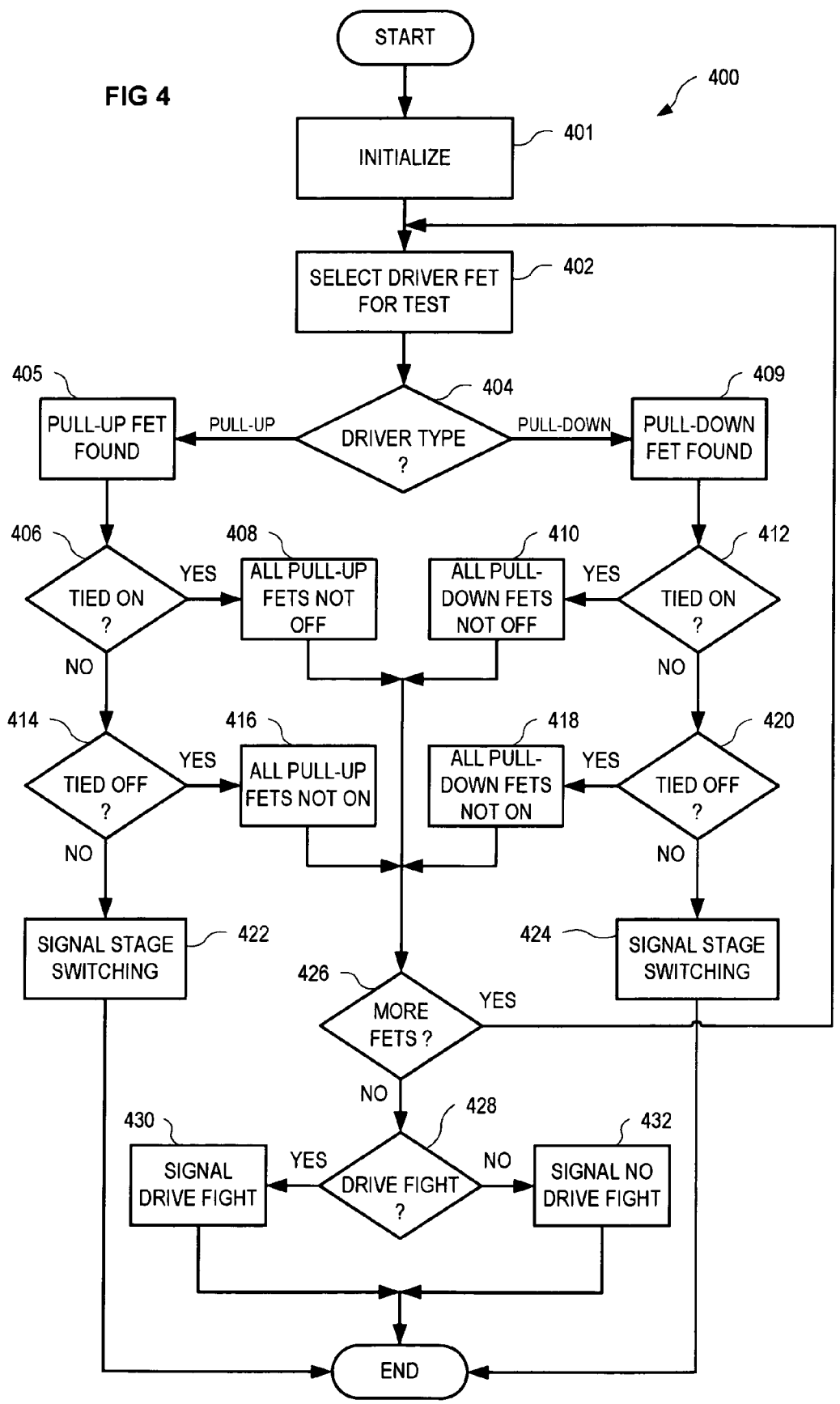

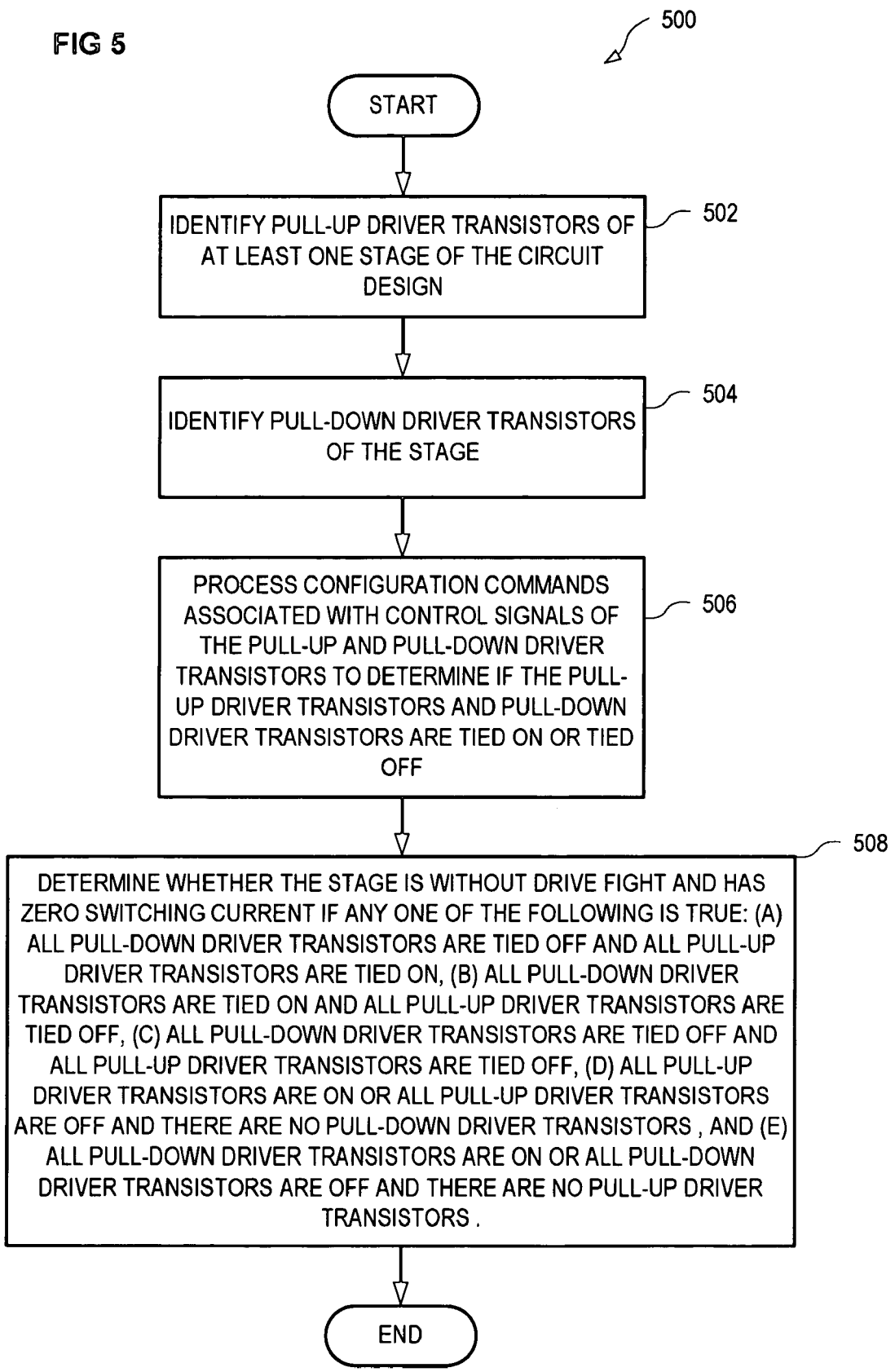

SYSTEM AND METHOD FOR DETERMINING DETAIL OF ANALYSIS IN A CIRCUIT DESIGN

RELATED APPLICATIONS

This application is related to the following commonly owned and co-filed U.S. patent applications, filed Jan. 30, 2004 and incorporated herein by reference: U.S. patent application Ser. No. 10/769,675, titled "Method and program product for determining worst case currents in a digital integrated circuit through worst-case superposition of partial currents"; U.S. patent application Ser. No. 10/769,495, titled "Systems and methods that identify equivalent instantiation-specific configuration information for analysis tools"; U.S. patent application Ser. No. 10/769,676, titled "System and method for indicating logic state combinations used during circuit design analysis"; U.S. patent application Ser. No. 10/769,702, titled "Systems and methods for re-using circuit design analysis results"; U.S. patent application Ser. No. 10/769,683, titled "System and method for balancing runtime and result accuracy in a circuit design analysis tool"; U.S. patent application Ser. No. 10/769,673, titled "System and method for determining control signal combinations for use during simulation of a stage of a circuit design"; U.S. patent application Ser. No. 10/768,442, titled "System and method for processing configuration information"; and U.S. patent application Ser. No. 10/769,682, titled "System and method to limit analyzed current flow in a circuit design".

BACKGROUND

An electronic computer aided design ("E-CAD") tool is utilized to construct a Very Large Scale Integration ("VLSI") circuit design. The VLSI circuit design consists of a netlist that identifies electronic design elements (e.g., capacitors, transistors, resistors, etc.) and their interconnectivity (e.g., signal nets) within the VLSI circuit design. A significant characteristic of VLSI and other types of circuit design is a reliance on hierarchical description. A primary reason for using hierarchical description is to hide the vast amount of detail in a design. By reducing the distracting detail to a single object that is lower in the hierarchy, one can greatly simplify many E-CAD operations. For example, simulation, verification, design-rule checking, and layout constraints can all benefit from hierarchical representation, which makes them more computationally tractable. Since many circuit designs are too complicated to be easily considered in their totality, a complete design is often viewed as a collection of design element aggregates that are further divided into sub-aggregates in a recursive and hierarchical manner. In VLSI circuit design, these aggregates are commonly referred to as design blocks or cells. The use of a cell at a given level of hierarchy is called an 'instance'. Each cell has one or more 'ports', each of which provides a connection point between a signal net within the cell and a signal net external to the cell.

A signal net is a single electrical path in a circuit design that has the same electrical characteristics at all of its points. Any collection of wires that carries the same signal between design elements is a signal net. If the design elements allow the signal to pass through unaltered (as in the case of a terminal), then the signal net continues on subsequently connected wires. If, however, the design element modifies the signal (as in the case of a transistor or logic gate), then the signal net terminates at that design element and a signal new net begins on the other side. Connectivity in a circuit design is typically specified using a netlist, which indicates the specific nets that interconnect the various design elements.

A signal net may be divided into signal net 'pieces', each of which is part of a Highest Level Signal Name ("HLSN"). A HLSN is the unique signal name that identifies a collection of signal nets or 'hierarchical signal net pieces', which are the small pieces of intermediate wire (signal nets) in each hierarchical design block of a circuit design.

A design engineer uses the E-CAD tool to analyze the VLSI circuit design during development. The E-CAD tool typically selects a sub-circuit (known as a 'stage') within the circuit design for analysis. Each stage in the circuit design may have instantiation-specific configuration information (e.g., switching frequencies, activity factors and scaling factors of the design elements) that is used by the E-CAD tool during analysis of the stage. For example, the E-CAD tool may sum certain information (e.g., FET size, current, capacitance, or wire width) and utilize the instantiation-specific configuration information to determine overall analysis result.

FIG. 1 shows one exemplary stage 10 that includes two driver FETs 12 and 14, two receiver FETs 26 and 28, three control signal nets A, B, I, and one output signal net C. Stage 10 is used in the following example to illustrate switching current and drive fight.

Source terminals of driver FETs 12, 26 connect to power rail Voltage-Drain-Drain (VDD) by a signal net 16. A drain terminal of FET 12 connects to a source terminal of driver FET 14, and to gate terminals of receiver FETs 26 and 28 by control signal net I. Drain terminals of driver FET 14 and receiver FET 28 connect to a ground power rail (GND) by signal net 18. Control signal net A connects to a gate terminal of FET 12 and control signal net B connects to a gate terminal of driver FET 14. Receiver FETs 26 and 28 are connected to operate as an inverter that inverts control signal I to drive output signal O.

In an exemplary analysis of stage 10, current through receiver FETs 26 and 28 are not included during current simulations of stage 10. Nonetheless, FETs 26 and 28 create capacitive load on control signal I; this capacitive load is illustratively represented by a capacitor $C_{OUT}$ shown connected between control signal I and GND. When control signal net A is low and control signal B is high, driver FET 12 is turned off, driver FET 14 is turned on, and control signal I is pulled to GND, thereby discharging capacitance $C_{OUT}$ through driver FET 14 (i.e., control signal I is at GND potential). When control signal A is high and control signal B is low, driver FET 14 is turned off and driver FET 12 is turned on, pulling control signal I to VDD, thereby charging capacitor $C_{OUT}$ through driver FET 12 (i.e., control signal I is at VDD potential). Each transition of control signal I between GND and VDD draws current from VDD through driver FET 12 to charge capacitor $C_{OUT}$. Each transition of control signal I between VDD and GND sinks current to GND through driver FET 14. These currents are thus known as 'switching' current since they derive from control signal I switching states.

If a control signal does not switch states, it is known as a 'tied' signal (e.g., the control signal may be 'tied' high or low). Where a control signal for a driver FET (e.g., driver FETs 12 and 14) is tied, the driver FET remains either on or off, and is known as a 'tied' FET. If all driver FETs within a stage are tied FETs, the stage is known as a 'tied' stage and draws zero switching current.

If a signal is driven by two FETs, and one FET attempts to pull the signal to VDD and the other FET attempts to pull the signal to GND, a situation known as 'drive fight' occurs. For example, in stage 10, drive fight occurs when driver FET 12 and driver FET 14 are simultaneously turned on (e.g., input A and input B are both high). Control signal I is then simultaneously pulled high, by driver FET 12, and pulled low, by driver FET 14, causing current to flow continuously between power rail VDD and power rail GND through driver FETs 12 and 14.

If input A is tied high and input B is tied low, stage 10 is a tied stage with no drive fight, and thus draws zero current. Similarly, if input A is tied low and input B is tied high, stage 10 is a tied stage with no drive fight, and thus draws zero current. Even though no current is drawn, the E-CAD tool still performs time consuming detailed analyses of stage 10 to determine this zero current situation.

If the VLSI circuit design has billions of design elements, such analyses can take hours or even days of processing time to complete, resulting in lost productivity. Lost productivity due to lengthy engineering development slows technology advancement and can result in significant costs, as well as lost business.

SUMMARY OF THE INVENTION

In one embodiment, a method determines detail of analysis in a circuit design. Pull-up driver transistors of at least one stage of the circuit design are identified. Pull-down driver transistors of the stage are identified. Configuration commands associated with control signals of the pull-up and pull-down driver transistors are processed to determine if the pull-up driver transistors and pull-down driver transistors are tied on or tied off. A determination is made whether the stage has drive fight and switching current. A detailed analysis is performed of the stage if the stage has drive fight or switching current.

In another embodiment, a software product has instructions, stored on computer-readable media, wherein the instructions, when executed by a computer, perform steps for determining detail of analysis in a circuit design, including: instructions for identifying pull-up driver transistors of at least one stage of the circuit design; instructions for identifying pull-down driver transistors of the stage; instructions for processing configuration commands associated with control signals of the pull-up and pull-down driver transistors to determine if the pull-up driver transistors and pull-down driver transistors are tied on or tied off; instructions for determining whether the stage has drive fight and zero switching current; and instructions for performing detailed analysis of the stage if the stage has drive fight or switching current.

In another embodiment, a system determines detail of analysis in a circuit design, including: means for identifying pull-up driver transistors of one or more stages of the circuit design; means for identifying pull-down driver transistors of the stages; means for processing configuration commands associated with control signals of the pull-up and pull-down driver transistors to determine if the pull-up driver transistors and pull-down driver transistors are tied on or tied off; and means for determining whether the stages have drive fight and switching current; and means for performing detailed analysis of each stage having drive fight or switching current.

In another embodiment, a method detects zero switching current stages, without drive fight, in a circuit design. Pull-up driver transistors of at least one stage of the circuit design are identified. Pull-down driver transistors of the stage are identified. Configuration commands associated with control signals of the pull-up and pull-down driver transistors are processed to determine if the pull-up driver transistors and pull-down driver transistors are tied on or tied off. The stage is without drive fight and has zero switching current if any one of the following is true: (a) all pull-down driver transistors are tied off and all pull-up driver transistors are tied on, (b) all pull-down driver transistors are tied on and all pull-up driver transistors are tied off, (c) all pull-down driver transistors are tied off and all pull-up driver transistors are tied off, (d) all pull-up driver transistors are on or all pull-up driver transistors are off and there are no pull-down driver transistors, and (e) all pull-down driver transistors are on or all pull-down driver transistors are off and there are no pull-up driver transistors.

BRIEF DESCRIPTION OF THE FIGURES

FIG. 4 is a flowchart illustrating one embodiment of a process for detecting stages with zero switching current and no drive fight in a circuit design.

FIG. 5 is a flowchart illustrating one embodiment of a process for detecting stages with zero switching current and no drive fight in a circuit design.

DETAILED DESCRIPTION OF THE FIGURES

To reduce analysis time for a circuit design, stages that are non-switching and without drive fight are identified prior to analysis; and current results for these identified stages are set to zero. Detailed analysis of these stages is therefore unnecessary, reducing analysis time for the circuit design.

Figure 2:
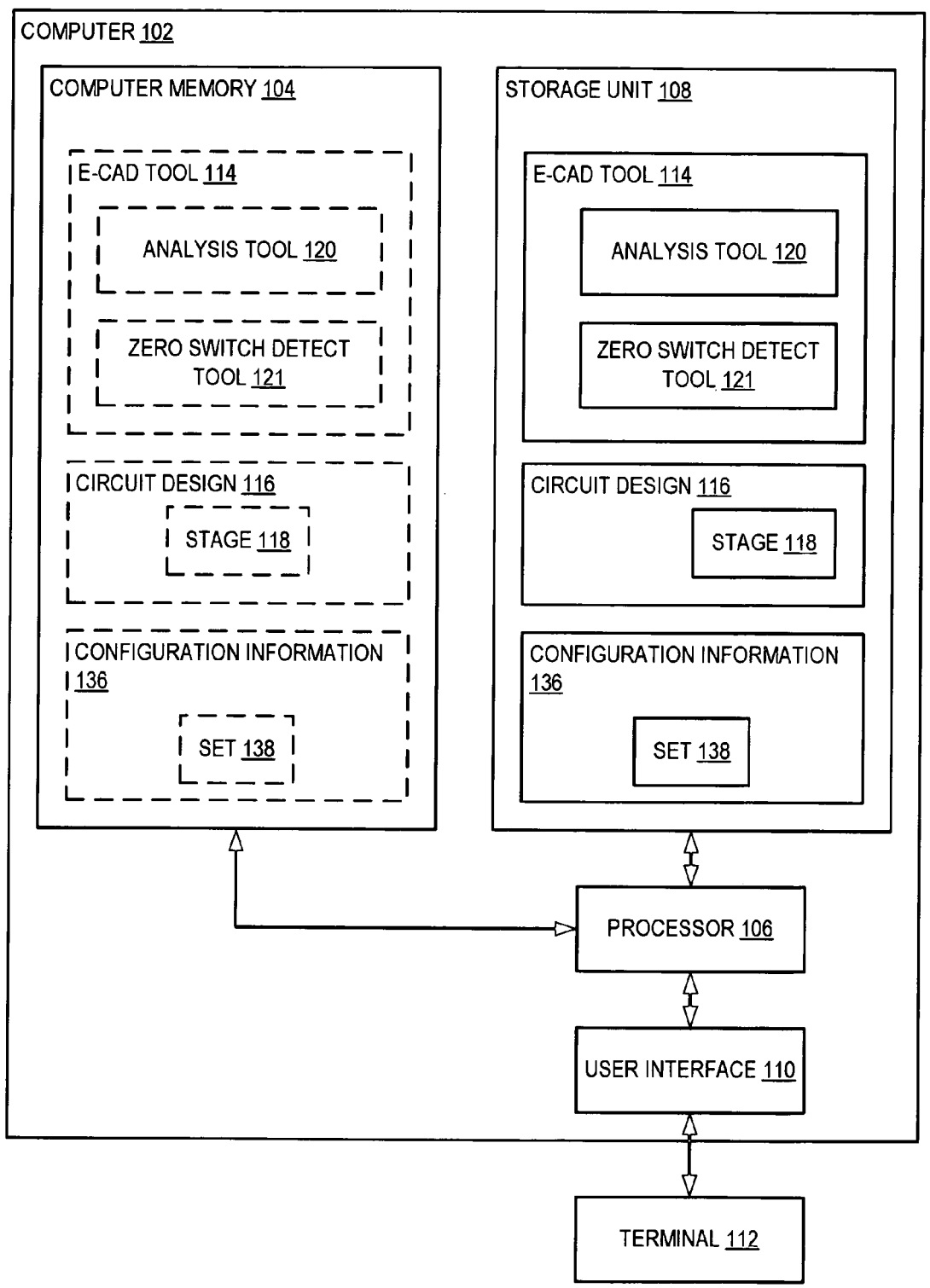
FIG. 2 illustrates one system embodiment that detects zero switching current stages in a circuit design.

FIG. 2 illustrates one system 100 that detects zero switching current stages in a circuit design 116. System 100 has a computer 102 with a computer memory 104, at least one processor 106, a storage unit 108 and a user interface 110. Storage unit 108 may for example be a disk drive that stores programs and data of computer 102. Storage unit 108 is illustratively shown storing an E-CAD tool 114, circuit design 116 and configuration information 136. E-CAD tool 114 includes an analysis tool 120 and a zero switch detect tool 121. Circuit design 116 is, for example, a very large scale integration (VLSI) circuit design created by E-CAD tool 114. Circuit design 116 is shown with one exemplary stage 118 that identifies circuitry within circuit design 116 slated for analysis by analysis tool 120, for example. Only one stage 118 is shown within circuit design 116 for purposes of illustration; circuit design 116 may have additional stages as a mater of design choice.

Processor 106 loads E-CAD tool 114 from storage unit 108 into computer memory 104 such that E-CAD tool 114 is executable by processor 106. E-CAD tool 114 may in turn request that processor 106 load analysis tool 120, zero switch detect tool 121, circuit design 116, stage 118 and configuration information 136 from storage unit 108 into computer memory 104. E-CAD tool 114, analysis tool 120, zero switch detect tool 121, circuit design 116, configuration information 136 and configuration set 138 are shown with dashed lines within computer memory 104 for purposes of illustration. Once loaded into computer memory 104, a design engineer operates E-CAD tool 114 to process and analyze circuit design 116 based on configuration information 136. Configuration information 136 is illustratively shown with a configuration set 138 that contains configuration information related to stage 118. Configuration set 138 may include rise and fall times of signals input to stage 118, logic configuration commands that define input signal combinations to stage 118, activity factors of signals internal to stage 118, crossover current scale factors that define an amount of signal conflict during a signal switch, capacitance adjustments on various signal nets, or combinations thereof.

Analysis tool 120 is, for example, an electromigration analysis tool that determines current though one or more resistors within circuit design 116, comparing the current with pre-defined limits.

By way of example, user interface 110 connects to a terminal 112 (e.g., a keyboard) external to computer 102. Through terminal 112 and user interface 110, the design engineer interacts with E-CAD tool 114 and analysis tool 120. In one example, the design engineer instructs E-CAD tool 114 to analyze circuit design 116 using analysis tool 120. Analysis tool 120 utilizes zero switch detect tool 121 to identify stages with zero switching current and without drive fight. Once such stages are identified, unnecessary current analysis by analysis tool 120 are prevented, reducing overall analysis time of circuit design 116.

Configuration information 136 may include logic commands that define states of input signals to a stage during analysis. Example logic commands are given below.

| Example Logic Commands | |
|---|---|
| Command 1: | if0then1 A B |
| Command 2: | if1then0 A B |
| Command 3: | if0then0 A B |
| Command 4: | if1then1 A B C D |
| Command 5: | mutex0 A B C D |
| Command 6: | mutex1 A B C D |
| Command 7: | imutex0 A B C D |
| Command 8: | imutex1 A B C D |
| Command 9: | set_high A |
| Command 10: | set_low A |

In command 1, if signal A is 0 then signal B is set to 1. In command 2, if signal A is 1 then signal B is set to 0. In command 3, if signal A is zero then signal B is set to 0. In command 4, if signal A is 1 then signals B, C and D are set to 1. In command 5, exactly one of signals A, B, C and D is set to 0 at any one time. In command 6, exactly one of signals A, B, C and D is set to 1 at any one time. In command 7, no more than one of signals A, B, C and D is set to 1 at any time, although all signals listed may be 0. In command 8, no more than one of signals A, B, C and D is set to 0 at any one time, although all signals may be 1. In command 9, signal A is always set to 0. In command 10, signal A is always set to 1.

Figure 3:
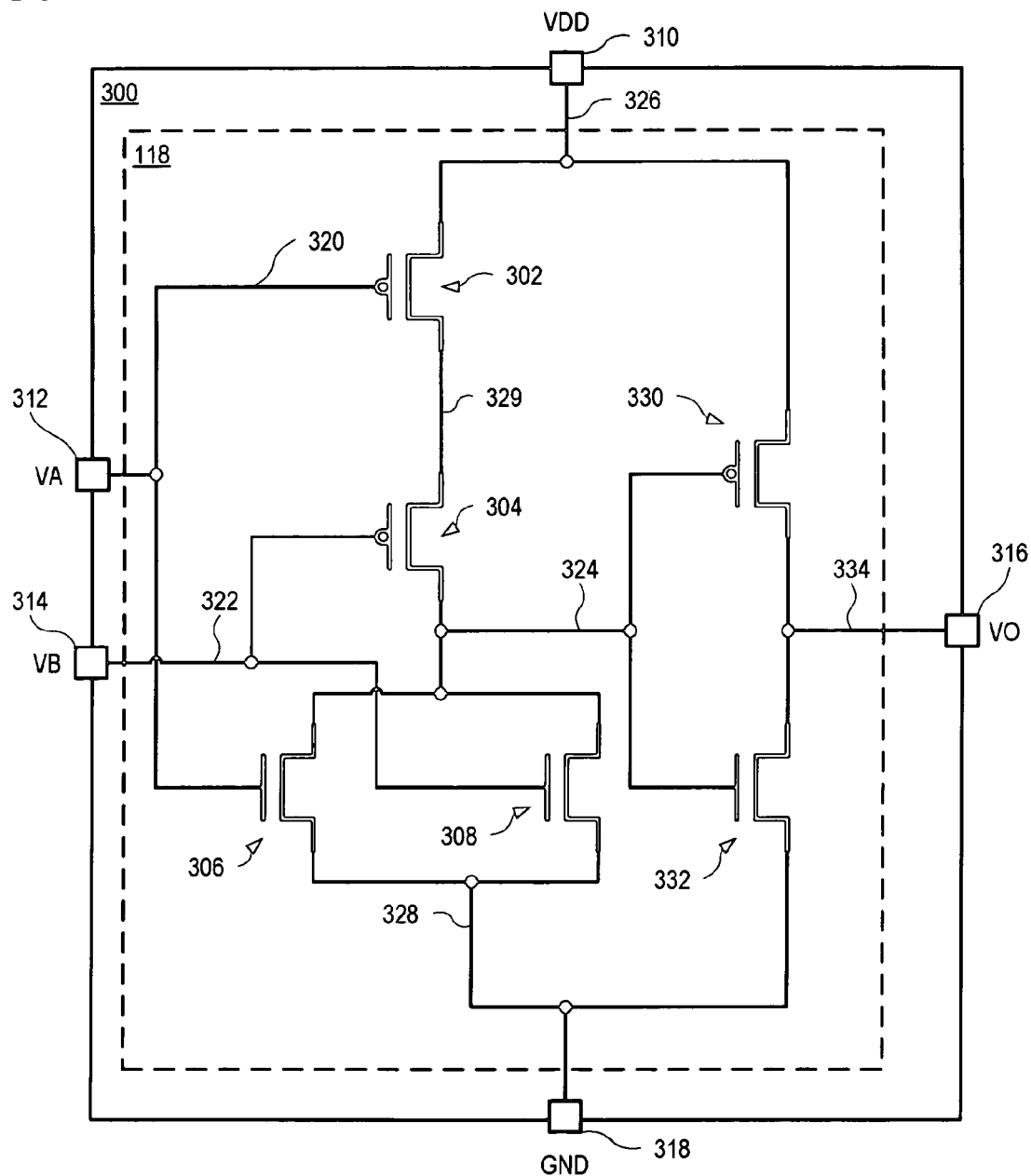
FIG. 3 is a schematic diagram of one exemplary cell that includes one zero switching current stage.

FIG. 3 is a schematic diagram of one exemplary cell 300 that includes three driver field-effect transistors ("FETs") 302, 306 and 308, one non-driver FET 304 and two receiver FETs 330 and 332. FETs 302, 304, 306 and 308 are configured as a two input NOR gate. FETs 330 and 332 are connected to form an inverter. Cell 300 is suitable for use within circuit design 116, FIG. 2, and illustratively shows exemplary detail of stage 118. FETs 302 and 304 are p-type FETs connected to form a 'pull-up stack'. FETs 306 and 308 are n-type FETS connected in parallel and are 'pull-down' FETS.

Cell 300 has five ports 310, 312, 314, 316 and 318. Port 310 connects to power rail Voltage-Drain-Drain (VDD) and port 318 connects to a ground power rail (GND). A signal net 320 connects an input port 312 to a gate terminal of FET 302 and a gate terminal of FET 306. A signal net 322 connects port 314 to a gate terminal of FET 304 and a gate terminal of FET 308. A signal net 326 connects source terminals of FETs 302 and 330 to port 310 (VDD). A signal net 328 connects drain terminals of FETs 306, 308 and 332 to port 318 (GND). A signal net 324 connects a source terminal of FET 306, a source terminal of FET 308, a drain terminal of FET 304 and gate terminals of receiver FETs 330 and 332. A signal net 329 connects a drain terminal of FET 302 to a source terminal of FET 304, thereby connecting FETs 302 and 304 in series between port 310 VDD and signal net 324, to form the pull-up stack. In cell 300, three FETs are considered driver FETs as they connect to either VDD or GND: FETs 306 and 308 are pull-down driver FETs connected to GND, and FET 302 is a pull-up driver FET connected to VDD. FET 304 does not connect to either VDD or GND, and therefore is not a driver FET.

In the following example, stage 118 of FIG. 3 is analyzed by E-CAD tool 114. In the example, FETs 330 and 332 are receiver FETs and are not included in the circuit analysis.

Figure 1:
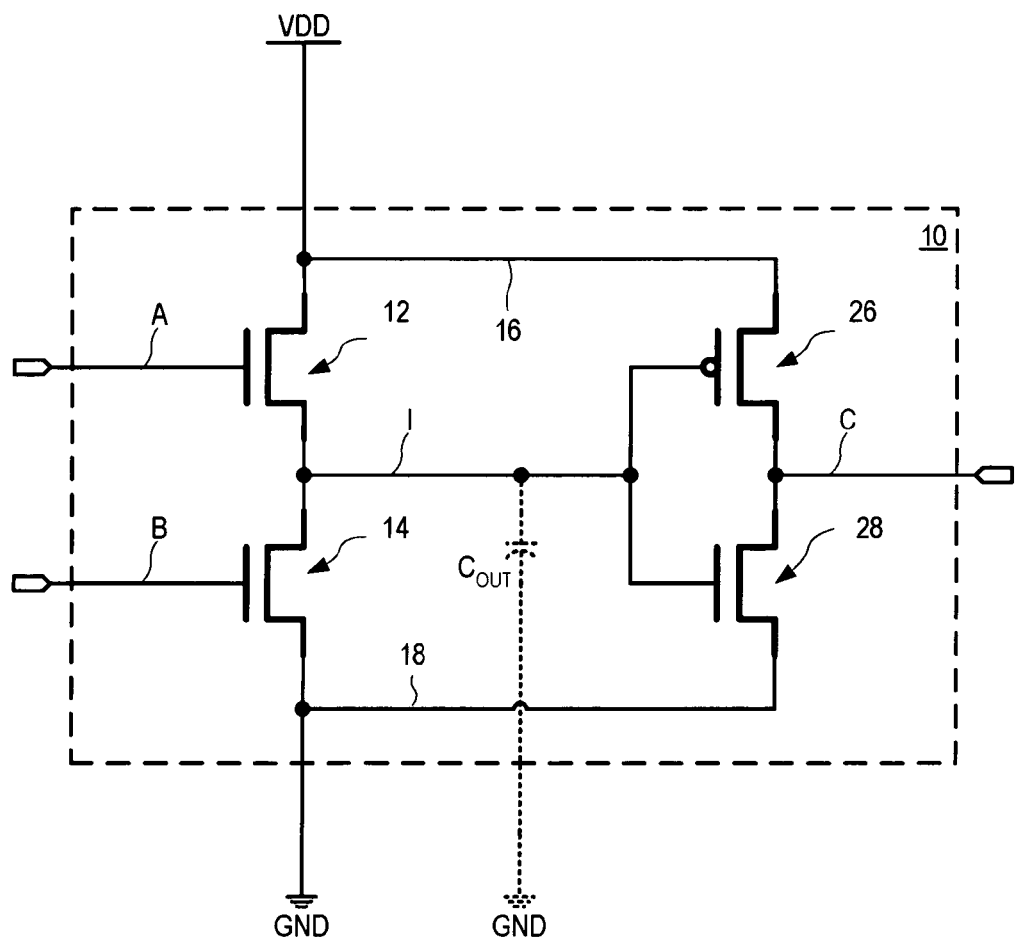
FIG. 1 shows one exemplary stage that includes a pull-up field-effect transistor, a pull-down field-effect transistor, and an output capacitance to illustrate switching current and drive fight.

Prior to detailed analysis of stage 118 by analysis tool 120, zero switch detection tool 121, FIG. 2, determines if stage 118 has zero switching current and is without drive fight. In one example of illustrative operation, zero switch detect tool 121 analyzes configuration set 138 associated with stage 118 to determine if inputs VA and VB are tied to either VDD or GND (i.e., to determine if inputs VA, VB are non-switching). If all control signals of stage 118 are non-switching, stage 118 is identified as a 'tied stage'. Then, if no drive fight occurs within stage 118, stage 118 draws substantially no current; system 100, FIG. 1, thus decides that detailed analysis (e.g., by analysis tool 120) is not needed for stage 118 since current drawn by stage 118 is assumed zero.

Pseudo Code 1, below, describes one method for detecting zero switching current stages without drive fight. Pseudo Code 1 is, for example, implemented within zero switch detect tool 121 as a function that returns true if a stage has zero switching current and no drive fight; otherwise the function returns false.

| Pseudo Code 1 |
|---|

```
// Initialization
boolean : all_pu_fets_on = true;
boolean : all_pd_fets_on = true;
boolean : all_pu_fets_off = true;
boolean : all_pd_fets_off = true;
boolean : found_up_fets = false;
boolean : found_pd_fets = false;
for each driver FET
{
    if (FET is a pull-up FET)
    {
        found_pu_fets = true;
        if (FET is tied ON)
        {
            all_pu_fets_off = false;
        }
        else if (FET is tied OFF)
        {
            all_pu_fets_on = false;
        }
```

-continued

Pseudo Code 1

```
        else
        {
            return false;    // Pull-up FET has switching
                             // input - stage not tied off
        }
    }
    else if (FET is a pull-down FET)
    {
        found_pd_fets = true;
        if (FET is tied ON)
        {
            all_pd_fets_off = false;
        }
        else if (FET is tied OFF)
        {
            all_pd_fets_on = false;
        }
        else
        {
            return false;    // Pull-down FET has switching
                             // input - stage not tied off
        }
    }
}
// Stage is non-switching - check for drive fight
return (  (all_pu_on && all_pd_off) ||
          (all_pu_off && all_pd_on) ||
          (all_pu_off && all_pd_off) ||
          ((all_pu_off || all_pu_on) && !found_pd_fets) ||
          ((all_pd_off || all_pd_on) && !found_pu_fets));
```

Using FIG. 2 and FIG. 3, zero switch detect tool 121 implements Pseudo Code 1 to determine if stage 118 is a tied stage with zero switching current and without driver fight. Pseudo Code 1 first initializes four variables (all_pu_pfets_on, all_pu_fets_off, all_pd_fets_on, and all_pd_fets_off) to true and two variables (found_pu_fets and found_pd_fets) to false. These variables are used to determine if drive fight can occur within stage 118. Variable all_pu_fets_on remains true if no pull-up driver FET is turned off; variable all_pufets_off remains true if no pull-up driver FET is turned on; variable all_pd_fets_on remains true if no pull-down driver FET is turned off; variable all_pd_fets_off remains true if no pull-down driver FET is turned on; variable found_pu_fets remains false if there are no pull-up driver FETs in stage 118; and variable found_pd_fets remains false if there are no pull-down driver FETs in stage 118. Pseudo Code 1 illustratively uses a 'for loop' construct to test control signals associated with each driver FET (e.g., FETs 302, 306 and 308) of stage 118 to determine if the driver FETs are tied on, tied off, or switching. If any driver FET is switching (i.e., the control signal associated with the FET is not tied on or tied off), the function returns false without further iterations of the 'for' loop, since stage 118 has switching current. If any pull-up driver FETs are tied on, working variable all_pu_fets_off is set to false since at least one pull-up driver FET turned on. If any pull-up driver FETs are tied off, working variable all_pu_fets_on is set to false since at least one pull-up driver FET is turned off. If any pull-down driver FETs are tied on, all_pd_fets_off is set to false since at least one pull-down driver FET is turned on. If any pull-down driver FETs are tied off, working variable all pd_fets_on is set to false since at least one pull-down driver FET is turned off.

When all driver FETs have been tested and no driver FETs are switching, a Boolean equation is evaluated, for example, to determine if drive fight can occur within stage 118. If variables all pu_fets_on and all_pd_fets_off are true, indicating that all pull-up driver FETs are on and all pull-down driver FETs are off, stage 118 is without drive fight and the function returns true. If variables all_pu_fets_off and all_pd_fets_on are both true, indicating that all pull-up driver FETs are off and all pull-down driver FETs are on, stage 118 is without drive fight and the function returns true. If variables all_pu_fets_off and all_pd_fets_off are both true, indicating that all pull-up driver FETs are off and all pull-down driver FETs are off, stage 118 is without drive fight and the function returns true. If variable all_pu_off is true or variable all_pu_on is true and variable found_pd_fets is false (indicating that there are no pull-down driver FETs in stage 118), stage 118 is without drive fight and the function returns true. If variable all_pd_off is true, or variable all_pd_on is true, and variable found_up_fets is false (indicating that there are no pull-up driver FETs in stage 118), stage 118 is without drive fight and the function returns true. Other logic combinations of variables all_pu_fets_on, all_pu_fets_off, all_pd_fets_on, all_pd_fets_off, found_pd_fets and found_pu_fets indicate that drive fight may occur within stage 118; the function therefore returns false.

Implementing Pseudo Code 1, zero switch detect tool 121 thus identifies stages (e.g., stage 118) of circuit design 116 that have zero switching current and are without drive fight. Alternate algorithms may be used within zero switch detect tool 121 to detect stages with zero switching current, and without drive fight, without departing from the scope hereof.

FIG. 4 is a flowchart illustrating one process 400 for detecting stages (e.g., stage 118) with zero switching current and no drive fight in circuit design 116. Process 400 is, for example, implemented by zero switch detect tool 121, FIG. 2. In step 401, process 400 initializes four Boolean variables, all_pull_up_fets_off, all_pull_up_fets_on, all_pull_down_fets_off, all_pull_down_fets_on, to true and two Boolean variables, found_pd_fets and found_pu_fets, to false.

In step 402, process 400 selects a current driver FET for testing from a current stage (e.g., stage 118), for analysis by analysis tool 120. For example, in step 402, process 400 selects driver FET 302, FIG. 3, as the current driver FET for testing. Step 404 is a decision. If the current driver FET is a pull-up driver FET, process 400 continues with step 405; otherwise process 400 continues with step 409. In one example of step 404, driver FET 302 connects to power rail VDD and is a pull-up driver FET; process 400 therefore continues with step 405. In another example of step 404, driver FET 306 connects to power rail GND, and is a pull-down driver FET; process 400 therefore continues with step 409.

In step 405, process 400 sets variable found_pu_fets to true. Step 406 is a decision. If the current driver FET selected in step 402 is tied on, process 400 continues with step 408; otherwise process 400 continues with step 414. In one example of step 406, if control signal 320 of p-type driver FET 302 is tied low, then driver FET 302 is tied on and process 400 continues with step 408. In step 408, process 400 sets variable all-pull-up-fets-off to false since the current driver FET is a pull-up FET that is tied on; and process 400 continues with step 426.

In step 409, process 400 sets variable found_pd_fets to true. Step 412 is a decision. If the current driver FET (a pull-down FET selected in step 402) is tied on, process 400 continues with step 410; otherwise process 400 continues with step 420. In one example of step 412, if control signal 320 of n-type driver FET 306 is tied high (i.e., the control signal is continuously high) then driver FET 306 is tied on and process 400 continues with step 410. In step 410, process 400 sets variable all-pull-down-fets-off to false since the current FET is a pull-down FET that is tied on; and process 400 continues with step 426.

Step 414 is a decision. If the current FET (a pull-up FET selected in step 402) is tied off, process 400 continues with step 416; otherwise process 400 continues with step 422. In one example of step 414, if control signal 320 of p-type driver FET 302 (selected in step 402) is tied high (i.e., continuously high) then driver FET 302 is tied off and process 400 continues with step 416. In step 416, process 400 sets variable all-pull-up-fets-on to false since the current driver FET is a pull-up FET that is tied off; and process 400 continues with step 426.

Step 420 is a decision. If the current driver FET (a pull-down FET selected in step 402) is tied off, process 400 continues with step 418; otherwise process 400 continues with step 424. In one example of step 420, if control signal 332 of n-type driver FET 308 is tied low (i.e., continuously low) then driver FET 308 is tied off and process 400 continues with step 418. In step 418, process 400 sets variable all-pull-down-fets-on to false since the current driver FET is a pull-up FET that is tied off; and process 400 continues with step 426.

In step 422, process 400 signals that the current stage is switching and does not have zero switching current. Process 400 then terminates without processing other driver FETs of the current stage. In step 424, process 400 signals that the current stage is switching and does not have zero switching current. Process 400 then terminates without processing other driver FETs of the current stage.

Step 426 is a decision. If the current stage (e.g., stage 118) contains more driver FETs, process 400 continues with step 402; otherwise process 400 continues with step 428. Steps 402, 404, 405, 406, 408, 409, 410, 412, 414, 416, 418, 420, 422, 424 and 426 repeat until all driver FETs of the current stage are tested by process 400.

Step 428 is a decision. If 'drive fight' can occur in the current stage, process 400 continues with step 430; otherwise process 400 continues with step 432. In one example of step 428, if (1) variables all pu_fets_on and all_pd_fets_off are true, or (2) variables all_pu_fets_off and all_pd_fets_on are both true, or (3) variables all_pu_fets_off and all_pd_fets_off are both true, or (4) variable all_pu_off is true or variable all_pu_on is true and variable found_pd_fets is false, or (5) variable all pd off is true or variable all_pd_on is true and variable found_pu_fets is false, then no drive fight can occur and process continues with step 432; otherwise process 400 continues with step 430.

In step 430, process 400 signals that a drive fight can occur in the current stage. In one example of step 430, process 400 indicates that drive fight can occur in stage 118, and therefore detailed analysis of stage 118 is necessary. Process 400 then terminates.

In step 432, process 400 signals that no drive fight can occur in the current stage. In one example of step 432, process 400 indicates that stage 118 is without drive fight, and therefore analysis of stage 118 is not necessary. Process 400 then terminates.

Upon reading a comprehending this disclosure, those of ordinary skill in the art appreciate that analysis time of a circuit design may be reduced by using process 400 to detect stages (e.g., stage 118) with zero switching current and without drive fight in a circuit design (e.g., circuit design 116) that do not require analysis.

FIG. 5 is a flowchart illustrating one process 500 for detecting stages with zero switching current and no drive fight in a circuit design. Process 500 is, for example, implemented in zero switch detect tool 121, FIG. 1. In step 502, process 500 identifies pull-up driver transistors of at least one stage of the circuit design. In step 504, process 500 identifies pull-down driver transistors of the stage. In step 506, process 500 processes configuration commands associated with control signals of the pull-up and pull-down driver transistors to determine if the pull-up driver transistors and pull-down driver transistors are tied on or tied off. In step 508, process 500 determines whether the stage is without drive fight and has zero switching current if any one of the following is true: (a) all pull-down driver transistors are tied off and all pull-up driver transistors are tied on, (b) all pull-down driver transistors are tied on and all pull-up driver transistors are tied off, (c) all pull-down driver transistors are tied off and all pull-up driver transistors are tied off, (d) all pull-up driver transistors are on or all pull-up driver transistors are off and there are no pull-down driver transistors, and (e) all pull-down driver transistors are on or all pull-down driver transistors are off and there are no pull-up driver transistors.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for determining detail of analysis in a circuit design, comprising:

identifying pull-up driver transistors of at least one stage of the circuit design;

identifying pull-down driver transistors of the stage;

processing configuration commands associated with control signals of the pull-up and pull-down driver transistors to determine if the pull-up driver transistors and pull-down driver transistors are tied on or tied off;

determining whether the stage is without drive fight and has zero switching current by determining whether any one of the following is true: (a) all pull-down driver transistors are tied off and all pull-up driver transistors are tied on, (b) all pull-down driver transistors are tied on and all pull-up driver transistors are tied off, (c) all pull-down driver transistors are tied off and all pull-up driver transistors are tied off, (d) all pull-up driver transistors are on or all pull-up driver transistors are off and there are no pull-down driver transistors, and (e) all pull-down driver transistors are on or all pull-down driver transistors are off and there are no pull-up driver transistors; and performing detailed analysis of the stage if the stage has drive fight or switching current.

2. The method of claim 1, the step of processing comprising determining, for each one of the pull-up driver transistors, whether the one pull-up driver transistor is tied on by determining whether (a) the one pull-up driver transistor is a p-type transistor and a control signal of the one pull-up driver transistor is tied low or (b) the one pull-up driver transistor is a n-type transistor and the control signal is tied high.

3. The method of claim 1, the step of processing comprising determining, for each one of the pull-up driver transistors, whether the one pull-up driver transistor is tied off by determining whether (a) the one pull-up driver transistor is a p-type transistor and a control signal of the one pull-up driver transistor is tied high or (b) the one pull-up driver transistor is a n-type transistor and the control signal is tied low.

4. The method of claim 1, the step of processing comprising determining, for each one of the pull-down driver transistors, whether the one pull-down driver transistor is tied on by determining whether (a) the one pull-down driver transistor is a p-type transistor and a control signal of the one pull-down driver transistor is tied low or (b) the one pull-down driver transistor is a n-type transistor and the control signal is tied high.

5. The method of claim 1, the step of processing comprising determining, for each one of the pull-down driver transistors, whether the one pull-down driver transistor is tied off by determining whether (a) the one pull-down driver transistor is a p-type transistor and a control signal of the one pull-down driver transistor is tied high or (b) the one pull-down driver transistor is a n-type transistor and the control signal is tied low.

6. The method of claim 1, the step of identifying pull-up driver transistors comprising identifying driver transistors with a source terminal connected to a VDD power rail.

7. The method of claim 1, the step of identifying pull-down driver transistors comprising identifying driver transistors with a drain terminal connected to a GND power rail.

8. A software product comprising instructions, stored on computer-readable media, wherein the instructions, when executed by a computer, perform steps for determining detail of analysis in a circuit design, comprising:
    instructions for identifying pull-up driver transistors of at least one stage of the circuit design;
    instructions for identifying pull-down driver transistors of the stage;
    instructions for processing configuration commands associated with control signals of the pull-up and pull-down driver transistors to determine if the pull-up driver transistors and pull-down driver transistors are tied on or tied off;
    instructions for determining whether the stage is without drive fight and has zero switching current by determining whether any one of the following is true: (a) all pull-down driver transistors are tied off and all pull-up driver transistors are tied on, (b) all pull-down driver transistors are tied on and all pull-up driver transistors are tied off, (c) all pull-down driver transistors are tied off and all pull-up driver transistors are tied off, (d) all pull-up driver transistors are on or all pull-up driver transistors are off and there are no pull-down driver transistors, and (e) all pull-down driver transistors are on or all pull-down driver transistors are off and there are no pull-up driver transistors; and
    instructions for performing detailed analysis of the stage if the stage has drive fight or switching current.

9. The software product of claim 8, the instructions for processing comprising instructions for determining, for each one of the pull-up driver transistors, whether the one pull-up driver transistor is tied on by determining whether (a) the one pull-up driver transistor is a p-type transistor and a control signal of the one pull-up driver transistor is tied low or (b) the one pull-up driver transistor is a n-type transistor and the control signal is tied high.

10. The software product of claim 8, the instructions for processing comprising instructions for determining, for each one of the pull-up driver transistors, whether the one pull-up driver transistor is tied off by determining whether (a) the one pull-up driver transistor is a p-type transistor and a control signal of the one pull-up driver transistor is tied high or (b) the one pull-up driver transistor is a n-type transistor and the control signal is tied low.

11. The software product of claim 8, the instructions for processing comprising instructions for determining, for each one of the pull-down driver transistors, whether the one pull-down driver transistor is tied on by determining whether (a) the one pull-down driver transistor is a p-type transistor and a control signal of the one pull-down driver transistor is tied low or (b) the one pull-down driver transistor is a n-type transistor and the control signal is tied high.

12. The software product of claim 8, the instructions for processing comprising instructions for determining, for each one of the pull-down driver transistors, whether the one pull-down driver transistor is tied off by determining whether (a) the one pull-down driver transistor is a p-type transistor and a control signal of the one pull-down driver transistor is tied high or (b) the one pull-down driver transistor is a n-type transistor and the control signal is tied low.

13. The software product of claim 8, the instructions for identifying pull-up driver transistors comprising instructions for identifying driver transistors with a source terminal connected to a VDD power rail.

14. The software product of claim 8, the instructions for identifying pull-down driver transistors comprising instructions for identifying driver transistors with a drain terminal connected to a GND power rail.

15. A system for determining detail of analysis in a circuit design, comprising:
    means for identifying pull-up driver transistors of one or more stages of the circuit design;
    means for identifying pull-down driver transistors of the stages;
    means for processing configuration commands associated with control signals of the pull-up and pull-down driver transistors to determine if the pull-up driver transistors and pull-down driver transistors are tied on or tied off; and
    means for determining whether a stage is without drive fight and has zero switching current by determining whether any one of the following is true: (a) all pull-down driver transistors are tied off, and all pull-up driver transistors are tied on, (b) all pull-down driver transistors are tied on and all pull-up driver transistors are tied off, (c) all pull-down driver transistors are tied off and all pull-up driver transistors are tied off, (d) all pull-up driver transistors are on or all pull-up driver transistors are off and there are no pull-down driver transistors, and (e) all pull-down driver transistors are on or all pull-down driver transistors are off and there are no pull-up driver transistors; and
    means for performing detailed analysis of each stage having drive fight or switching current.

16. A method for detecting zero switching current stages, without drive fight, in a circuit design, comprising:
    identifying pull-up driver transistors of at least one stage of the circuit design;
    identifying pull-down driver transistors of the stage;
    processing configuration commands associated with control signals of the pull-up and pull-down driver transistors to determine if the pull-up driver transistors and pull-down driver transistors are tied on or tied off; and
    determining whether the stage has drive fight and has zero switching current if any one of the following is true: (a) all pull-down driver transistors are tied off and all pull-up driver transistors are tied on, (b) all pull-down driver transistors are tied on and all pull-up driver transistors are tied off, (c) all pull-down driver transistors are tied off and all pull-up driver transistors are tied off, (d) all pull-up driver transistors are on or all pull-up driver transistors are off and there are no pull-down driver transistors, and (e) all pull-down driver transistors are on or all pull-down driver transistors are off and there are no pull-up driver transistors.

* * * * *